United States Patent
Khemka et al.

(10) Patent No.: US 7,763,937 B2
(45) Date of Patent: Jul. 27, 2010

(54) VARIABLE RESURF SEMICONDUCTOR DEVICE AND METHOD

(75) Inventors: Vishnu K. Khemka, Phoenix, AZ (US); Amitava Bose, Tempe, AZ (US); Todd C. Roggenbauer, Chandler, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 897 days.

(21) Appl. No.: 11/601,127

(22) Filed: Nov. 15, 2006

(65) Prior Publication Data
US 2008/0113498 A1    May 15, 2008

(51) Int. Cl.
*H01L 29/00* (2006.01)
(52) U.S. Cl. .............. 257/335; 257/339; 257/343; 257/E21.002; 438/266; 438/289
(58) Field of Classification Search ................ 257/335, 257/339, 343, E21.002; 438/286, 289
See application file for complete search history.

(56) References Cited
U.S. PATENT DOCUMENTS
5,796,146 A * 8/1998 Ludikhuize .............. 257/343

6,747,332 B2    6/2004  de Fresart et al.
2006/0246670 A1 * 11/2006  Khemka et al. ............. 438/285

\* cited by examiner

*Primary Examiner*—Zandra Smith
*Assistant Examiner*—Christy L Novacek
(74) *Attorney, Agent, or Firm*—Ingrassia, Fisher & Lorenz, P.C.

(57) ABSTRACT

Methods and apparatus are provided for semiconductor device (60, 95, 100, 106). The semiconductor device (60, 95, 100, 106), comprises a first region (64, 70) of a first conductivity type extending to a first surface (80), a second region (66) of a second, opposite, conductivity type forming with the first region (70) a first PN junction (65) extending to the first surface (80), a contact region (68) of the second conductivity type in the second region (66) at the first surface (80) and spaced apart from the first PN junction (65) by a first distance ($L_{DS}$), and a third region (82, 96-98, 108) of the first conductivity type and of a second length ($L_{BR}$), underlying the second region (66) and forming a second PN junction (63) therewith spaced apart from the first surface (80) and located closer to the first PN junction (65) than to the contact region (68). The breakdown voltage is enhanced without degrading other useful properties of the device (60, 95, 100, 106).

19 Claims, 5 Drawing Sheets

VARIABLE RESURF SEMICONDUCTOR DEVICE AND METHOD

TECHNICAL FIELD

The present invention generally relates to electronic devices, and more particularly to electronic devices employing reduced surface field (RESURF) structures.

BACKGROUND

The various devices and device regions illustrated herein are for N-channel devices or the like. However, this is merely for convenience of explanation and not intended to be limiting and persons of skill in the art will understand that the principles taught herein apply to devices of either conductivity type. Accordingly, the identification of particular regions as N-type or P-type is merely by way of illustration and not limitation and opposite conductivity type regions may be substituted in order to form devices of opposite conduction type.

FIG. 1 is a simplified schematic cross-sectional view of RESURF device 20, according to the prior art. Device 20 comprises P-type substrate 24, N-type drift space 26 and P-type well 30. N++ contact region 28 is provided to drift space 26. N++ contact region 28 has electrode 29 and external terminal 31. P-well 30 has P++ body contact region 32 therein and, by way of example and not intended to be limiting, N++ source region 34 therein. Electrode 33 with external terminal 35 makes ohmic contact to P++ body contact region 32 and optional N++ source region 34. The breakdown voltage $V_{BD}$ of device 20 is measured between terminals 35 and 31. Gate 36 and gate electrode 37 are illustrated, merely by way of example for an N channel transistor, but this is not intended to be limiting.

FIGS. 2-3 show plots 40, 50 of how the breakdown voltage $V_{DB}$ of device 20 varies as a function of the doping $N_a(24)$ of P-type substrate 24 (FIG. 2) and as a function of the doping $N_d(26)$ of N-type drift space 26 (FIG. 3). Referring now to FIGS. 1 and 2 together, trace 42 illustrates how changes in the doping of substrate region 24 cause the breakdown voltage of lateral junction 25 between N-type drift space 26 and P-type well region 30 to vary, and trace 44 illustrates how changes in the doping of substrate region 24 causes the breakdown voltage of vertical junction 27 between N-type drift space 26 and P-type substrate 24 to vary. In this example, N-type drift space 26 has a doping level of ~2E16 cm$^{-3}$. The breakdown voltage of device 20 is given by the combined results shown by heavier trace 46. This indicates that optimum (i.e., highest) breakdown voltage 48 is obtained for a P-type substrate doping level of about $N_a$~4E15 cm$^{-3}$.

Referring now to FIGS. 1 and 3 together, trace 52 illustrates how changes in the doping of N-type drift space 26 causes the breakdown voltage of vertical junction 27 between N-type drift space 26 and P-type substrate 24 to vary, and trace 54 illustrates how changes in the doping of substrate region 24 causes the breakdown voltage of lateral junction 25 between N-type drift space 26 and P-type well region 30 to vary. In this example, P-type substrate 24 has a doping level of $N_a$~4E15 cm$^{-3}$. The breakdown voltage of device 20 is given by the combined results shown by heavier trace 56. This indicates that optimum (i.e., highest) breakdown voltage 58 is obtained for an N-type drift space doping level in the range of about $N_d(26)$~1–2E16 cm$^{-3}$. Considering FIGS. 2 and 3 together, it is apparent that there is only one doping value $N_a(24)$ of P-type substrate 24 and a very narrow range of doping levels $N_d(26)$ for N-type drift space 26, that will give optimum breakdown voltage 58, in this case about $V_{BD}$~105 volts. It is known that by simultaneously adjusting the size and/or doping density of P-well 30, N-type drift space 26 and P-type substrate 24, that the breakdown voltage can be made larger, but this usually adversely affects other device properties. For example, making N-type drift space 26 longer can increase the breakdown voltage but also increases the ON-resistance which is undesirable.

Accordingly, it is desirable to provide semiconductor devices, especially RESURF type semiconductor devices having improved breakdown voltage, without a corresponding degradation of other important device properties. In addition, it is desirable that the modified structure and method needed to obtain such improved performance be compatible with available semiconductor device and integrated circuit fabrication tools and methods. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The invention will hereinafter be described in conjunction with the following drawing figures, wherein like numerals denote like elements.

DETAILED DESCRIPTION

Figure 1:
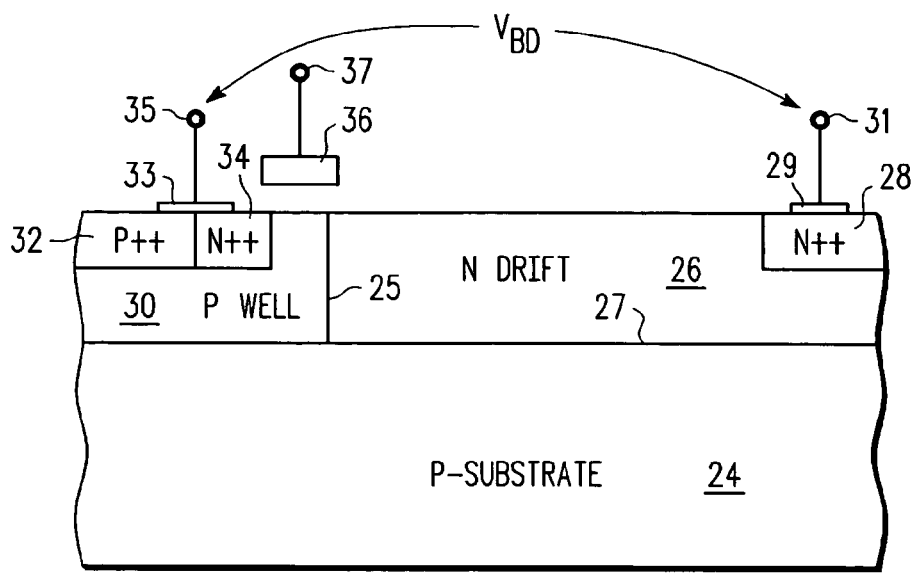
FIG. 1 is a simplified schematic cross-sectional view of a RESURF device, according to the prior art.
Figure 2:
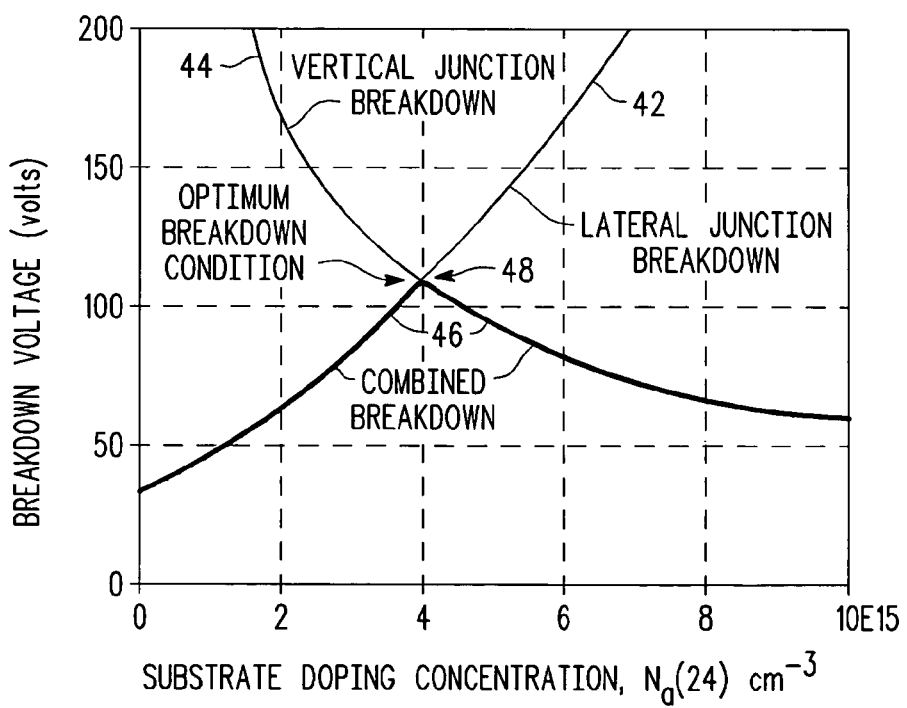
FIGS. 2-3 show plots of how the breakdown voltage of the prior art device of FIG. 1 varies as a function of the doping levels of several device regions.
Figure 3:
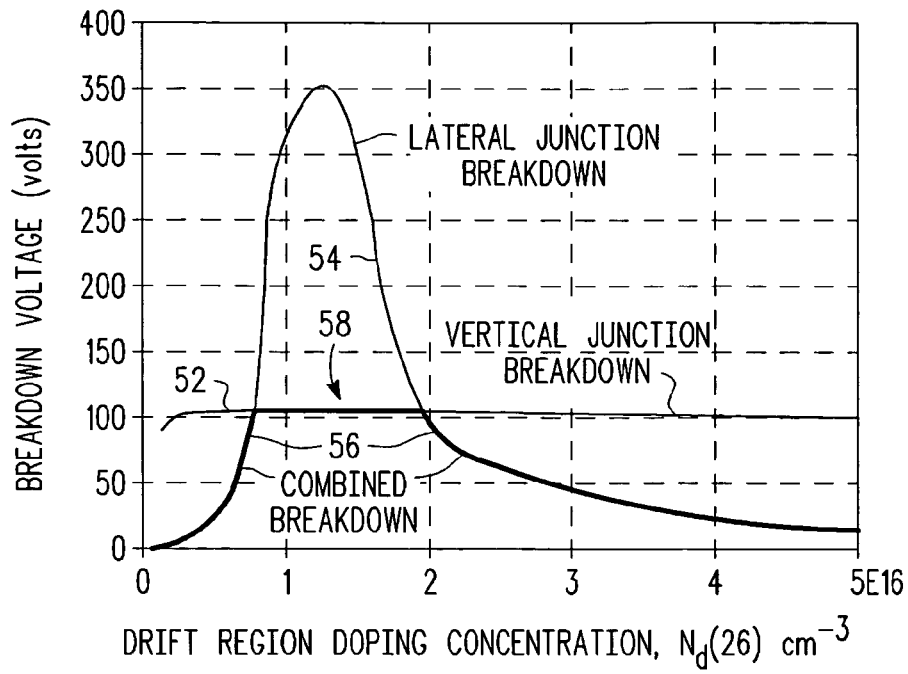

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," right," "in," "out," "front," "back," "up," "down," "top," "bottom," over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

Figure 4:
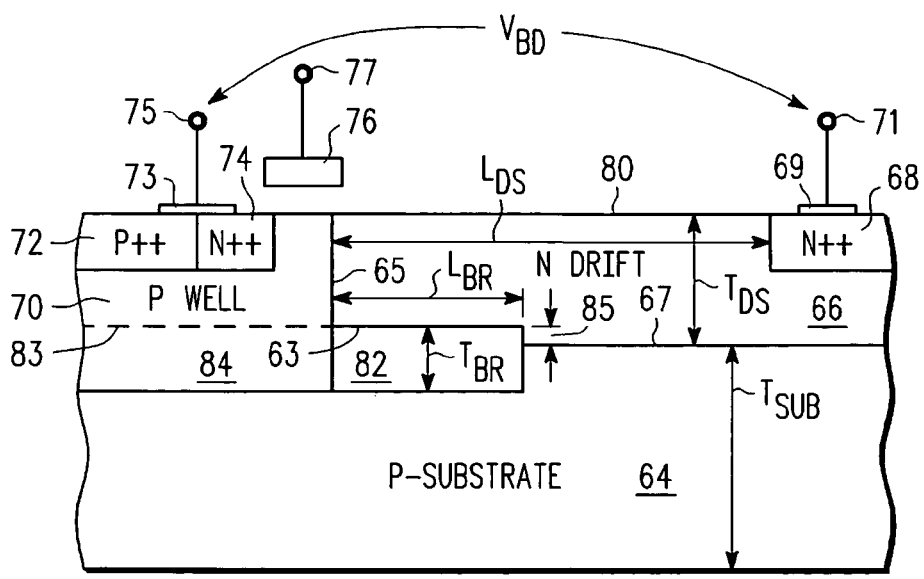
FIG. 4 is a simplified schematic cross-sectional view of a semiconductor device, analogous to that of FIG. 1, but according to an embodiment of the invention.

FIG. 4 is a simplified schematic cross-sectional view of semiconductor device 60, analogous to that of device 20 of FIG. 1, but according to an embodiment of the invention. Device 60 comprises P-type substrate 64 of thickness $T_{SUB}$, N-type drift space or region 66 and P-type well 70, analogous to regions 24, 26, and 30 respectively of device 10 of FIG. 1. N-type drift space 66 has N++ contact region 68 with contact 69 and external electrode 71, analogous to contact region 28, contact 29 and electrode 31 of device 20 of FIG. 1. N-type drift space 66 has length $L_{DS}$ between PN junction 65 where P-well 70 and N-type drift space 66 meet and N++ contact region 68. Drift space 66 has thickness $T_{DS}$ between surface 80 and PN junction 67 where drift space 66 and P-type substrate 64 meet. P-type well 70 has P++ body contact region 72 and optional N++ source region 74, with contact 73 and external electrode 75, analogous to elements 32, 34, 33 and 35, respectively, of device 20 of FIG. 1. Gate 76 and gate electrode 77 analogous to gate 36 and gate electrode 37 of device 20 are also illustrated, but are not essential to the present invention.

Device 60 of FIG. 4 differs from device 20 of FIG. 1 by inclusion of P-type buried region 82 located, in this embodiment, in P-type substrate 64 adjacent PN junctions 65 and 67, that is, abutting P-well 70 and lying under and forming PN junction 63 with drift space 66. Buried region 82 is ohmically coupled to P-well 70 (and body contact 72) and may have its left end substantially aligned with PN junction 65 (e.g., as shown by the solid lines in FIG. 4) or extend under and/or into P-well 70, as indicated for example, by dashed line 83 and region 84, or may be spaced to the right of PN junction 65 as is illustrated for example in FIG. 7. Buried region 82 has length $L_{BR}$ in the direction of drift space 66 (i.e., substantially parallel to length $L_{DS}$) and thickness $T_{BR}$ substantially perpendicular to length $L_{BR}$ (i.e., substantially parallel to $T_{BL}$). Buried region 82 may extend into drift space 66 by amount 85, but this is not critical. What is important is that it be generally located in contact with the portion of drift space 66 that is relatively remote from contact 68 and be ohmically coupled to P-well 70, either directly or via P-type substrate 64. However, as is further explained in connection with FIGS. 6-8, considerable variation in the location of buried region 82 relative to contact region 68 and P-well 70 may be made. The breakdown voltage $V_{BD}$ is measured between terminals 75 and 71.

Figure 5:
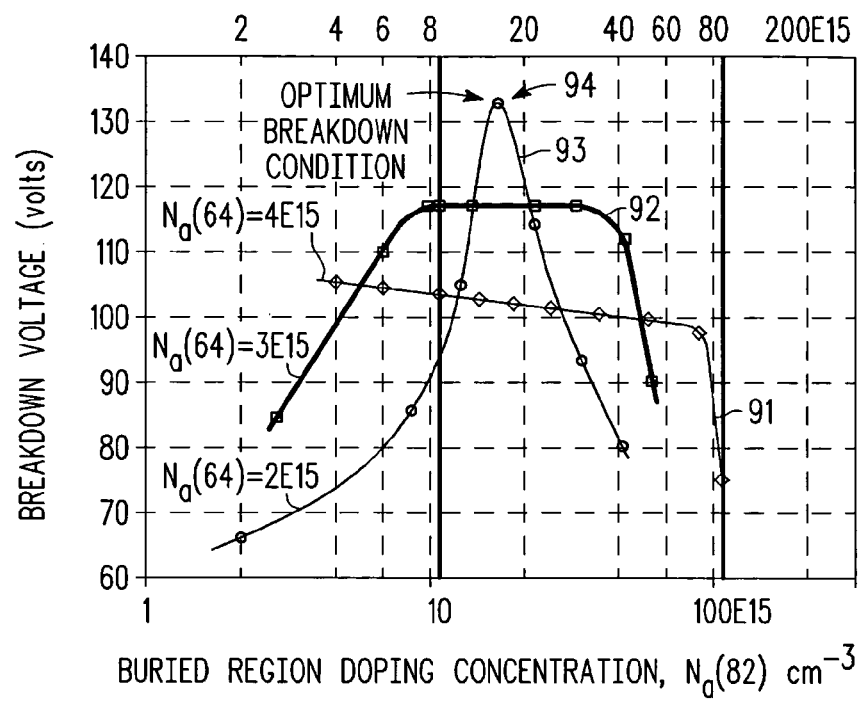
FIG. 5 show plots of how the breakdown voltage of the device of FIG. 4 varies as a function of the doping levels of several device regions.

In discussing the relative doping of the various regions, the convention is followed of identifying the average doping level of various regions by their reference numbers. For example, the doping level of N-type drift space 66 is identified as $N_d(66)$, the doping level of P-type well region 70 is identified as $N_a(70)$, the doping level of P-type substrate region 64 is identified as $N_a(64)$, the doping level of P-type buried region 82 is identified as $N_a(82)$, and similarly for other regions identified elsewhere. FIG. 5 shows plot 90 of how the breakdown voltage of device 60 of FIG. 4 varies as a function of the doping level of buried region 82 in the range of about $N_a(82)$ ~2E15 cm$^{-3}$ to 1E17 cm$^{-3}$, for several different doping levels of P-type substrate region 64, and for the same doping level of N-type drift space 66 of about $N_d(66)$~1-2E16 cm$^{-3}$. Trace 91 corresponds to $N_a(64)$~4E15 cm$^{-3}$, trace 92 to $N_a(64)$~3E15 cm$^{-3}$, and trace 93 to $N_a(64)$~2E15 cm$^{-3}$. It will be noted that optimum (maximum) value 94 of breakdown voltage $V_{BD}$ now obtained is about 132 volts at $N_a(64)$ of ~2E15 cm$^{-3}$ and $N_a(82)$ of ~1.5E16 cm$^{-3}$. Compared to the results from otherwise analogous prior art device 20, an improvement in breakdown voltage $\Delta V_{BD}=(132-105)/105=26\%$ is obtained. Since substantially the same doping level is being used for N-type drift space 66 and P-well 70, there is no significant increase in the ON-resistance or degradation of other device properties. This is a significant improvement and enhances the performance of the invented device compared to the prior art.

In general, it is important that $L_{BR}<L_{DS}$, with the ratio $L_{BR}:L_{DS}$ usefully in the range of 1:10 to 5:10, more conveniently in the range of about 1.5:10 to 4:10 and preferably in the range of about 2:10 to 3:10, where buried region 82 is substantially uniformly doped along its length $L_{BR}$. If buried region 82 is non-uniformly doped along its length $L_{BR}$ (e.g., see FIG. 8) then the $L_{BR}:L_{DS}$ ratio can be adjusted accordingly. For example, if $N_a(82)$ declines toward region 68, then $L_{BR}$ can be increased for the same net effect. For greatest effect, it is desirable that doping in the different regions have the relationships described below, wherein:

$N_a(70)$ is desirably greater than $N_d(66)$, where the ratio $N_a(70):N_d(66)$ is usefully in the range of about 2:1 to 100:1, conveniently in the range of about 5:1 to 50:1 and preferably about 10:1; and $N_a(70)$ is desirably greater than $N_a(82)$, where the ratio $N_a(70):N_a(82)$ is usefully in the range of about 2:1 to 100:1, conveniently in the range of about 5:1 to 50:1 and preferably about 10:1; and $N_a(82)$ is desirably greater than $N_a(64)$, where the ratio $N_a(82):N_a(64)$ is usefully in the range of about 2:1 to 50:1, conveniently in the range of about 5:1 to 20:1 and preferably about 10:1.

Figure 6:
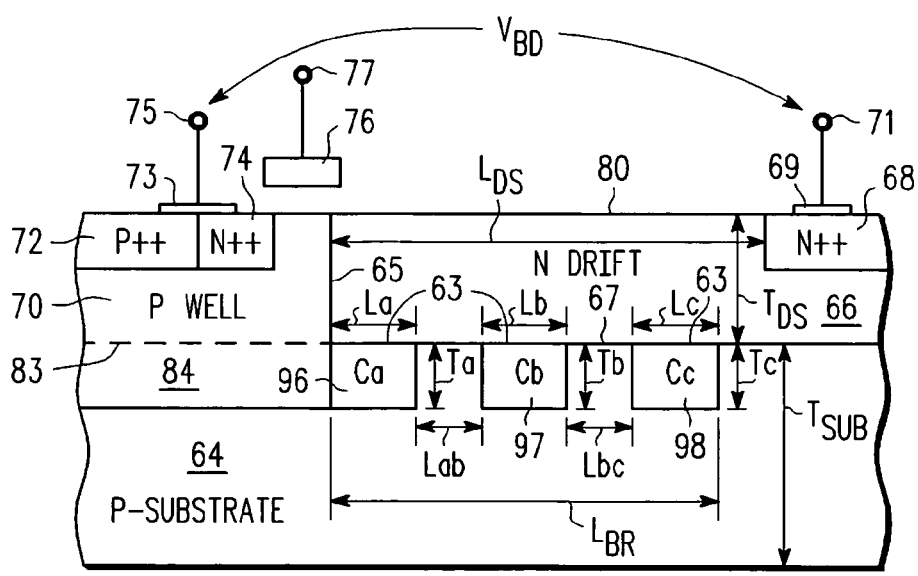
FIGS. 6-8 are simplified schematic cross-sectional views of semiconductor devices, analogous to that of FIG. 4, but according to further embodiments of the invention.
Figure 7:
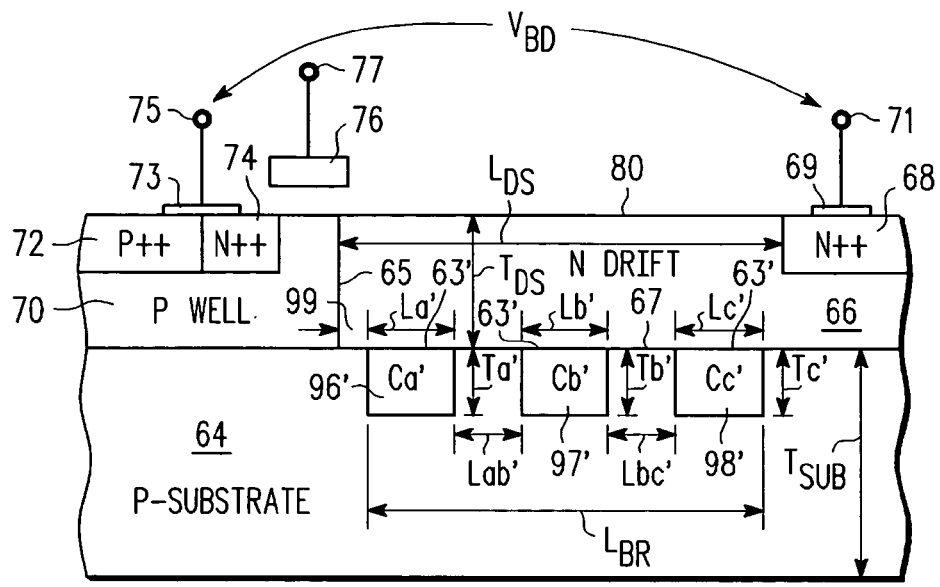
Figure 8:
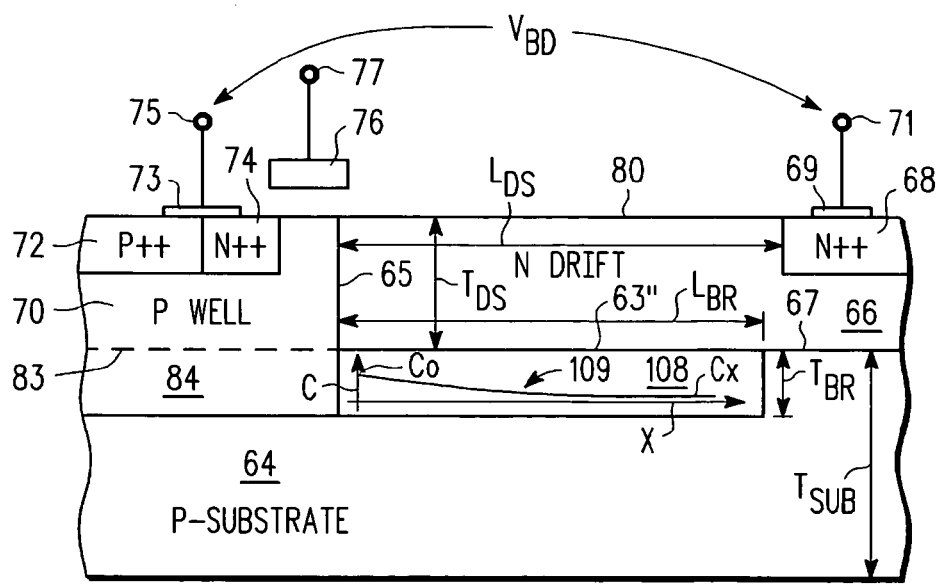

FIGS. 6-8 are simplified schematic cross-sectional views of semiconductor devices 95, 100, 106, analogous to device 60 of FIG. 4, but according to further embodiments of the invention. Referring now to FIG. 6, device 95 differs from device 60 in that P-type buried region 82 is broken up into several sub-regions 96, 97, 98. For convenience of explanation and not intended to be limiting, only three sub-regions 96, 97, 98 are illustrated in FIGS. 6 and 7, but persons of skill in the art will understand that more or fewer sub-regions can also be used. Accordingly, sub-regions 96, 97, 98 are intended to be representative of such fewer or more sub-regions. Sub-regions 96, 97, 98, etc., are located in P-substrate 64 lying under and forming PN junctions 63 with drift region 66, but separated from contact region 68. In FIG. 6, first sub-region 96 has its left edge generally aligned with junction 65. It may also extend into P-well 70 as indicated by dashed line 83 and region 84, which may be considered a part of sub-region 96 in this example. Sub-region 96 has doping concentration $N_a(96)$ =Ca, length parallel to $L_{DS}$ of La, and depth substantially parallel to $T_{DS}$ of Ta. Sub-region 97 has doping concentration $N_a(97)$=Cb, length parallel to $L_{DS}$ of Lb, depth substantially parallel to $T_{DS}$ of Tb, and is separated from region 96 by distance Lab. Sub-region 98 has doping concentration $N_a(96)$=Cc, length parallel to $L_{DS}$ of Lc, depth substantially parallel to $T_{DS}$ of Tc and is separated from region 97 by distance Lbc. In general, it is desirable that Ca>Cb>Cc. Thicknesses Ta, Tb, Tc may be equal or different. However, if Ca=Cb=Cc, then by arranging for Ta>Tb>Tc, a similar effect may be obtained as having Ca>Cb>Cc. Either arrangement is useful. Separations Lab and Lbc may be the same or different. Either arrangement is useful. If regions 96, 97, 98, etc., are formed using a common implant step then Ta, Tb and Tc would be about equal and Ca, Cb and Cc would be about equal. This is convenient. However, to create the same effect as Ca>Cb>Cc, one can make La>Lb>Lc or Lab<Lbc and so on if there are more sub-regions. Either arrangement is useful.

Referring now to FIG. 7, device 100 differs from device 95 of FIG. 6 in that sub-regions 96', 97', 98' and forming PN junctions 63' with drift space 66, analogous to sub-regions 96, 97, 98 and PN junctions 63, are displaced from P-well 70 and junction 65 by amount 99. As noted earlier, for convenience of explanation and not intended to be limiting, three regions 96', 97', 98' are illustrated, but fewer or more sub-regions regions can also be used. Sub-region 96' has doping concentration $N_a(96')$=Ca', length parallel to $L_{DS}$ of La', and depth substantially parallel to $T_{DS}$ of Ta'. Sub-region 97' has doping concentration $N_a(97')$=Cb', length parallel to $L_{DS}$ of Lb', depth substantially parallel to $T_{DS}$ of Tb', and is separated from region 96' by distance Lab'. Sub-region 98' has doping concentration $N_a(98')$=Cc', length parallel to $L_{DS}$ of Lc', depth substantially parallel to $T_{DS}$ of Tc' and is separated from region 97' by distance Lbc'. These distances and regions are analogous to similarly identified regions without the prime (') shown in FIG. 6, and the same considerations concerning relative doping concentrations, sizes and spacing described therein apply and are incorporated herein by reference.

Referring now to FIG. 8, device 106 of FIG. 8 differs from device 60 of FIG. 4, in that buried region 108 (generally analogous in function to region 82 of FIG. 4) underlying and forming PN junction 63'' with drift space 66, and of length $L_{BR}$ and thickness $T_{BR}$, has variable doping. For example, assuming for convenience of explanation and not intended to be limiting, that the left edge of buried region 108 ohmically communicates with P-well 70 and is aligned approximately with junction 65, then buried region 108 has dopant concentration C of about C=Co at that edge, and then C falls off with increasing distance x to the right toward N++ region 68, as indicated by graph 109 superimposed on region 108. Alternatively, where the doping concentration C is constant with x then thickness $T_{BR}$ may vary with x, dropping off as x increases. Both approaches are useful. While a single region of variable doping and/or thickness is illustrated in FIG. 8 and multiple regions of the same or different doping and/or thickness are illustrated in FIGS. 6-7, these arrangements may be advantageously combined in still further embodiments, especially in connection with high voltage devices. For example, region 108 may be divided into two or more sub-regions wherein the doping and/or thickness varies as a function of distance x toward contact region 68. Stated another way, when multiple doped regions are provided, such as are illustrated for example in FIGS. 6-7, the doping concentration and/or thickness may be varied within the different regions as well as or in addition to variations from region to region. Persons of skill in the art will understand based on the description herein that such variations are within the scope of the various embodiments presented herein.

Figure 9:
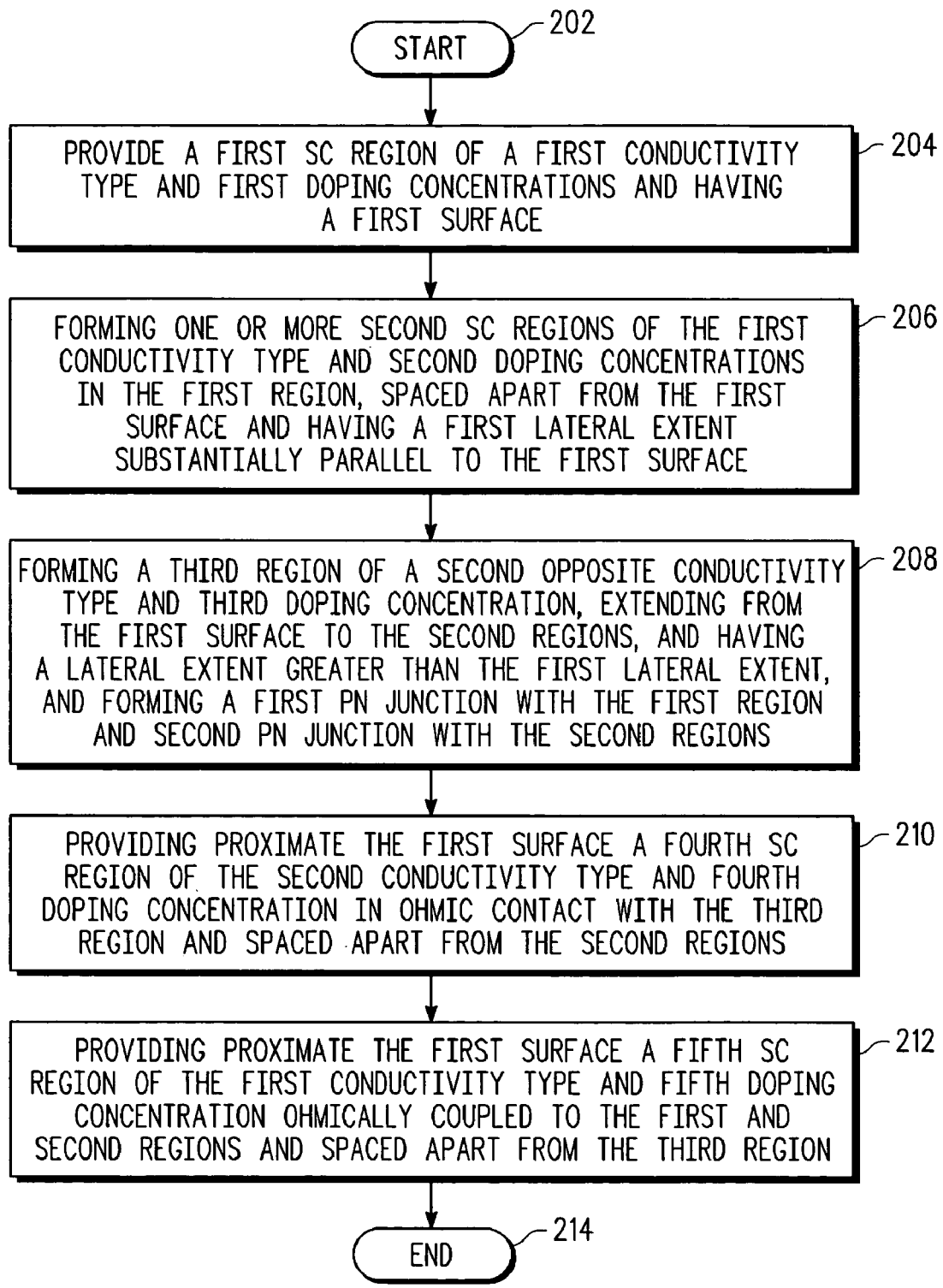
FIG. 9 is a simplified schematic flow chart illustrating a method of fabricating devices of the type illustrated in FIGS. 4 and 6-8, according to still further embodiments of the invention.

FIG. 9 is a simplified schematic flow chart illustrating method 200 of fabricating devices of the type illustrated in FIGS. 4 and 6-8, according to still further embodiments of the invention. In describing method 200, various reference numbers, doping types and concentrations are provided by way of examples of different regions that can be formed, but this is intended merely to facilitate understanding of various exemplary embodiments and not by way of limitation. Method 200 begins with START 202 and initial step 204 wherein a first semiconductor (SC) region (e.g., region 64) of a first conductivity type (e.g., P-type) and doping concentration (e.g., $N_a(64)$) and having a first surface (e.g., surface 80), is provided. Subsequent steps 206 and 208 may be provided in either order. In step 206, one or more second semiconductor (SC) regions (e.g., regions 82, 96, 97, 98, 108, etc.) of the first conductivity type (e.g., P-type) and second doping concentrations (e.g., $N_a(82)$, Ca, Cb, Cc, C(x)) are formed in the first region (e.g., region 64), spaced apart from the first surface (e.g., surface 80) and having a first lateral extent (e.g., $L_{BR}$) substantially parallel to the first surface (e.g., surface 80). In step 208, a third semiconductor (SC) region (e.g., 66) of a second opposite conductivity type (e.g., N-type) and third doping concentration (e.g., $N_a(66)$) is formed, extending from the first surface (e.g., surface 80) to the second regions (e.g., regions 82, 96, 97, 98, 108, etc.), and having a lateral extent (e.g., $L_{DS}$) greater than the first lateral extent (e.g., $L_{BR}$) and forming a first PN junction (e.g., junction 65, 67) with the first region (e.g., region 64 and/or regions 64, 70) and second PN junctions (e.g., junctions 63, 63', 63'') with the second regions (e.g., regions 82, 96, 97, 98, 108, etc.). Steps 210 and 212 may be performed in either order. In step 210, a fourth semiconductor (SC) region (e.g., region 68) of the second conductivity type (e.g., N-type) and fourth doping concentration (e.g., N++), is provided proximate the first surface (e.g., surface 80) in ohmic contact with the third region (e.g., region 66) and spaced apart from the second regions (e.g., regions 82, 96, 97, 98, 108, etc.). In step 212, a fifth semiconductor (SC) region (e.g., region 72) of the first conductivity type (e.g., P-type) and fifth doping concentration (e.g., P++) is provided proximate the first surface (e.g. surface 80) ohmically coupled to the second regions (e.g., regions 82, 96, 97, 98, 108, etc.) and spaced apart from the third region (e.g., region 66). In the illustrated embodiment, method 200 then proceeds to END 214. However, persons of skill in the art will also understand that in further embodiments, additional fabrication steps may also be performed in which a further region of the first conductivity type (e.g. P-well 70) and concentration (e.g., $N_a(70)$) is provided in ohmic contact with the first region (e.g., region 64), and/or a still further region (e.g., region 74) of the second conductivity type (e.g., N-type) and concentration (e.g., N++) is provided proximate the first surface (e.g. surface 80) in the further region (e.g., P-well 70), and/or contacts (e.g. contacts 69, 73) are provided to the fourth region (e.g., region 68) and the fifth region (e.g., region 72) and still further region (e.g., region 74). In addition, a control electrode (e.g., gate 76) may be provided in a yet further embodiment, overlying a portion of the further region (e.g., P-well 70) extending to the first surface (e.g., surface 80) between the still further region (e.g., region 74) and the third region (e.g., region 66). A gate dielectric (not shown) is conveniently provided between the control electrode (e.g., gate 76) and the first surface (e.g., surface 80) to electrically insulate the control electrode (e.g., gate 76) from the first surface (e.g., surface 80).

According to a first embodiment, there is provided a semiconductor device comprising, a first region of a first conductivity type having a first portion extending to a first surface and a second portion spaced apart from the first surface, a second region of a second, opposite, conductivity type forming a first PN junction extending to the first surface with the first portion of the first region and a second PN junction with the second portion of the first region, a contact region of the second conductivity type in the second region at the first surface spaced apart from the first PN junction by a first distance ($L_{DS}$), and a region of the first conductivity type and of an overall second length ($L_{BR}$), underlying the second region and forming a third PN junction therewith and spaced apart from the first surface, wherein the third region has a portion located closer to the first PN junction than to the contact region. According to a further embodiment, the first length ($L_{DS}$) is greater than the second length ($L_{BR}$). According to a still further embodiment, the second length ($L_{BR}$) and the first length ($L_{DS}$) have a ratio ($L_{BR}:L_{DS}$) in the range of about 1:10 to 5:10. According to a yet further embodiment, the second length ($L_{BR}$) and the first length ($L_{DS}$) have a ratio ($L_{BR}:L_{DS}$) in the range of about 1.5:10 to 4:10. According to a still yet further embodiment, the second length ($L_{BR}$) and the first length ($L_{DS}$) have a ratio ($L_{BR}:L_{DS}$) in the range of about 2:10 to 3:10. According to a yet still further embodiment, the third region comprises two or more spaced apart sub-regions. According to another embodiment, the third region have a decreasing number of impurities of the first conductivity type as a function of distance toward the contact region. According to a still another embodiment, an average doping concentration in the third regions is greater than an average doping concentration in the second portion of the first region. According to a yet another embodiment, the average doping concentration in the third region exceeds the average doping concentration in the second portion of the first region by a ratio in the range of about 2:1 to 50:1. According to a still yet another embodiment, an average doping concentration in the first portion of the first region is greater than an average doping concentration in the third region. According to a yet still another embodiment, the average doping concentration in the first portion of the first region exceeds the average doping concentration in the third region by a ratio in the range of about 2:1 to 100:1.

According to a second embodiment, there is provided a method for forming a semiconductor device, comprising, providing a first semiconductor region of a first conductivity type and doping concentrations and having a first surface, then in any order, forming one or more second semiconductor regions of the first conductivity type and second doping concentrations in the first region, spaced apart from the first surface and having a first overall lateral extent ($L_{BR}$) substantially parallel to the first surface, forming a third semiconductor region of a second opposite conductivity type and third doping concentration extending from the first surface to the one or more second regions and having a lateral extent ($L_{DS}$) greater than the first lateral extent ($L_{BR}$) and forming a first PN junction with the first region and second PN junctions with the one or more second regions, providing a fourth semiconductor region of the second conductivity type and fourth doping concentration proximate the first surface in ohmic contact with the third region and spaced apart from the one or more second regions, and providing a fifth semiconductor region of the first conductivity type and fifth doping concentration proximate the first surface ohmically coupled to the one or more second regions and spaced apart from the third region. According to a further embodiment, the one or more second regions have a doping concentration that exceeds a doping concentration of a first portion the first region that underlies the third region. According to a still further embodiment, the doping concentration of at least part of the one or more second regions has a ratio to the doping concentration of the first portion the first region in the range of about 2:1 to 50:1. According to a yet further embodiment, a second portion of the first region that extends to the first surface has a doping concentration that exceeds the doping concentration of at least some of the one or more second regions. According to a still yet further embodiment, the second portion of the first region has a doping concentration that exceeds the doping concentration of at least some of the one or more second regions by a ratio in the range of 2:1 to 100:1.

According to a third embodiment, there is provided a semiconductor device comprising, a first region of a first conductivity type extending to a first surface, a second region of the first conductivity type ohmically coupled to the first region and spaced apart from the first surface, a third region of a second, opposite, conductivity type located between the second region and the first surface and forming a first PN junction with the first region and a second PN junction with the second region, and having a lateral extent ($L_{DS}$) extending from the first PN junction substantially parallel to the second PN junction, and one or more fourth regions of the first conductivity type ohmically coupled to the first region, underlying and forming third PN junctions with the third region, and having an overall lateral extent ($L_{BR}$) substantially parallel to the first surface that is less than $L_{DS}$. According to a further embodiment, a first of the one or more fourth regions is located substantially proximate the first PN junction. According to a still further embodiment, the ratio $L_{BR}:L_{DS}$ is in the range of 1:10 to 5:10. According to a yet further embodiment, the ratio $L_{BR}:L_{DS}$ is in the range of 2:10 to 3:10.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor device, comprising:
   a first region of a first conductivity type having a first portion extending to a first surface and a second portion spaced apart from the first surface;
   a second region of a second, opposite, conductivity type forming a first PN junction extending to the first surface with the first portion of the first region and a second PN junction with the second portion of the first region;
   a contact region of the second conductivity type in the second region at the first surface, spaced apart from the first PN junction by a first distance ($L_{DS}$); and
   a third region of the first conductivity type and of a second length ($L_{BR}$), underlying the second region and forming a third PN junction therewith and spaced apart from the first surface, wherein the third region has a portion located closer to the first PN junction than to the contact region, wherein the third region is non-uniformly doped along the second length.

2. The device of claim 1, wherein the first length ($L_{DS}$) is greater than the second length ($L_{BR}$).

3. The device of claim 2, wherein the second length ($L_{BR}$) and the first length ($L_{DS}$) have a ratio ($L_{BR}:L_{DS}$) in the range of about 1:10 to 5:10.

4. The device of claim 3, wherein the second length ($L_{BR}$) and the first length ($L_{DS}$) have a ratio ($L_{BR}:L_{DS}$) in the range of about 1.5:10 to 4:10.

5. The device of claim 4, wherein the second length ($L_{BR}$) and the first length ($L_{DS}$) have a ratio ($L_{BR}:L_{DS}$) in the range of about 2:10 to 3:10.

6. The device of claim 1, wherein an average doping concentration in the third region is greater than an average doping concentration in the second portion of the first region.

7. The device of claim 6, wherein the average doping concentration in the third region exceeds the average doping concentration in the second portion of the first region by a ratio in a range of about 2:1 to 50:1.

8. The device of claim 1, wherein an average doping concentration in the first portion of the first region is greater than an average doping concentration in the third region.

9. The device of claim 8, wherein the average doping concentration in the first portion of the first region exceeds the average doping concentration in the third region by a ratio in the range of about 2:1 to 100:1.

10. A semiconductor device, comprising:
a first region of a first conductivity type having a first portion extending to a first surface and a second portion spaced apart from the first surface;
a second region of a second, opposite, conductivity type forming a first PN junction extending to the first surface with the first portion of the first region and a second PN junction with the second portion of the first region;
a contact region of the second conductivity type in the second region at the first surface, spaced apart from the first PN junction by a first distance ($L_{DS}$); and
a third region of the first conductivity type and of a second length ($L_{BR}$), underlying the second region and forming a third PN junction therewith and spaced apart from the first surface, wherein the third region has a portion located closer to the first PN junction than to the contact region, and wherein the third region has a decreasing number of impurities of the first conductivity type as a function of distance toward the contact region.

11. A method for forming a semiconductor device, comprising:
providing a first semiconductor region of a first conductivity type and doping concentrations and having a first surface, then in any order;
forming one or more second semiconductor regions of the first conductivity type and second doping concentrations in the first region, spaced apart from the first surface and having a first overall lateral extent ($L_{BR}$) substantially parallel to the first surface, wherein the one or more second semiconductor regions are non-uniformly doped along the first overall lateral extent;
forming a third semiconductor region of a second opposite conductivity type and third doping concentration extending from the first surface to the one or more second regions and having a lateral extent ($L_{DS}$) greater than the first lateral extent ($L_{BR}$) and forming a first PN junction with the first region and second PN junctions with the one or more second regions;
providing a fourth semiconductor region of the second conductivity type and fourth doping concentration proximate the first surface in ohmic contact with the third region and spaced apart from the one or more second regions; and
providing a fifth semiconductor region of the first conductivity type and fifth doping concentration proximate the first surface ohmically coupled to the one or more second regions and spaced apart from the third region.

12. The method of claim 11, wherein the one or more second regions have a doping concentration that exceeds a doping concentration of a first portion of the first region that underlies the third region.

13. The method of claim 12, wherein the doping concentration of at least part of the one or more second regions has a ratio to the doping concentration of the first portion the first region in the range of about 2:1 to 50:1.

14. The method of claim 11, wherein a second portion of the first region that extends to the first surface has a doping concentration that exceeds the doping concentration of at least some of the one or more second regions.

15. The method of claim 14, the second portion of the first region has a doping concentration that exceeds the doping concentration of at least some of the one or more second regions by a ratio in the range of 2:1 to 100:1.

16. A semiconductor device, comprising:
a first region of a first conductivity type extending to a first surface;
a second region of the first conductivity type ohmically coupled to the first region and spaced apart from the first surface;
a third region of a second, opposite, conductivity type located between the second region and the first surface and forming a first PN junction with the first region and a second PN junction with the second region, and having a lateral extent ($L_{DS}$) extending from the first PN junction substantially parallel to the second PN junction; and
one or more fourth regions of the first conductivity type ohmically coupled to the first region, underlying and forming third PN junctions with the third region, and having an overall lateral extent ($L_{BR}$) substantially parallel to the first surface that is less than $L_{DS}$, wherein the one or more fourth regions are non-uniformly doped along the overall lateral extent.

17. The device of claim 16, wherein a first of the one or more fourth regions is located substantially proximate the first PN junction.

18. The device of claim 16, wherein the ratio $L_{BR}:L_{DS}$ is in the range of 1:10 to 5:10.

19. The device of claim 18 wherein the ratio $L_{BR}:L_{DS}$ is in the range of 2:10 to 3:10.

* * * * *